(12) United States Patent
Wilson et al.

(10) Patent No.: US 9,793,008 B2
(45) Date of Patent: Oct. 17, 2017

(54) SOFT POST PACKAGE REPAIR OF MEMORY DEVICES

(71) Applicant: Micron Technology, Inc., Boise, ID (US)

(72) Inventors: Alan J. Wilson, Boise, ID (US); Jeffrey Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/382,394

(22) Filed: Dec. 16, 2016

(65) Prior Publication Data

US 2017/0098480 A1    Apr. 6, 2017

Related U.S. Application Data

(63) Continuation of application No. 15/133,096, filed on Apr. 19, 2016, now Pat. No. 9,558,851, which is a
(Continued)

(51) Int. Cl.
  *G11C 7/00* (2006.01)
  *G11C 29/00* (2006.01)
  (Continued)

(52) U.S. Cl.
  CPC ............ *G11C 29/76* (2013.01); *G11C 11/408* (2013.01); *G11C 11/418* (2013.01); *G11C 17/16* (2013.01);
  (Continued)

(58) Field of Classification Search
  CPC .... G11C 7/24; G11C 29/00; G11C 2029/5606
  (Continued)

(56) References Cited

U.S. PATENT DOCUMENTS

| 3,886,323 A | 5/1975 | Miller et al. |
| 5,278,839 A | 1/1994 | Matsumoto et al. |

(Continued)

FOREIGN PATENT DOCUMENTS

WO    2016077248 A1    5/2016

OTHER PUBLICATIONS

First Office Action for ROC (Taiwan) Pat. Appln. No. 104111150 dated Aug. 22, 2016.
(Continued)

*Primary Examiner* — Han Yang
(74) *Attorney, Agent, or Firm* — Dorsey & Whitney LLP

(57) ABSTRACT

Apparatus and methods for soft post package repair are disclosed. One such apparatus can include memory cells in a package, volatile memory configured to store defective address data responsive to entering a soft post-package repair mode, a match logic circuit and a decoder. The match logic circuit can generate a match signal indicating whether address data corresponding to an address to be accessed matches the detective address data stored in the volatile memory. The decoder can select a first group of the memory cells to be accessed instead of a second group of the memory cells responsive to the match signal indicating that the address data corresponding to the address to be accessed matches the defective address data stored in the volatile memory. The second group of the memory cells can correspond to a replacement address associated with other defective address data stored in non-volatile memory of the apparatus.

20 Claims, 4 Drawing Sheets

Related U.S. Application Data continuation of application No. 14/246,589, filed on Apr. 7, 2014, now Pat. No. 9,343,184.

(51) Int. Cl.
  *G11C 11/418* (2006.01)
  *G11C 17/16* (2006.01)
  *G11C 17/18* (2006.01)
  *G11C 29/04* (2006.01)
  G11C 11/408 (2006.01)
  G11C 29/44 (2006.01)

(52) U.S. Cl.
  CPC .............. *G11C 17/18* (2013.01); *G11C 29/04* (2013.01); *G11C 29/70* (2013.01); *G11C 11/4087* (2013.01); *G11C 2029/4402* (2013.01)

(58) Field of Classification Search
  USPC .................................................. 365/200, 201
  See application file for complete search history.

(56) References Cited

U.S. PATENT DOCUMENTS

| | | |
|---|---|---|
| 5,764,878 A | 6/1998 | Kablanian et al. |
| 5,862,314 A | 1/1999 | Jeddeloh |
| 5,910,921 A | 6/1999 | Beffa et al. |
| 5,930,169 A | 7/1999 | Iwata et al. |
| 5,974,564 A | 10/1999 | Jeddeloh |
| 6,085,334 A | 7/2000 | Giles et al. |
| 6,367,030 B1 | 4/2002 | Yamauchi |
| 6,490,219 B2 | 12/2002 | Yoneya et al. |
| 6,665,226 B2 | 12/2003 | Yoneya et al. |
| 6,967,878 B2 | 11/2005 | Dono |
| 7,020,033 B2 | 3/2006 | Nagata et al. |
| 7,350,119 B1 | 3/2008 | Zuraski, Jr. et al. |
| 7,436,222 B2 | 10/2008 | Shyr et al. |
| 7,437,626 B2 | 10/2008 | Chang et al. |
| 7,535,780 B2 * | 5/2009 | Lee ..................... G06F 11/1016 365/189.07 |
| 7,536,267 B2 | 5/2009 | Zimmerman et al. |
| 7,606,102 B2 | 10/2009 | Blodgett |
| 7,684,266 B2 | 3/2010 | Lee |
| 7,746,712 B2 | 6/2010 | Kang et al. |
| 7,768,847 B2 | 8/2010 | Ong et al. |
| 8,086,916 B2 | 12/2011 | Kopel |
| 8,379,460 B2 | 2/2013 | Jeong |
| 8,593,891 B2 | 11/2013 | Nishioka et al. |
| 8,645,583 B2 | 2/2014 | Vu et al. |
| 9,343,184 B2 | 5/2016 | Wilson et al. |
| 9,349,491 B1 | 5/2016 | Morgan et al. |
| 2002/0051400 A1 | 5/2002 | Yoneya et al. |
| 2002/0133769 A1 | 9/2002 | Cowles et al. |
| 2003/0031075 A1 | 2/2003 | Yoneya et al. |
| 2003/0038649 A1 | 2/2003 | D'Angelo |
| 2005/0041491 A1 | 2/2005 | Kyung |
| 2005/0097383 A1 | 5/2005 | Puri et al. |
| 2005/0149782 A1 | 7/2005 | McPartland |
| 2010/0046292 A1 | 2/2010 | Hahn et al. |
| 2010/0124132 A1* | 5/2010 | Sarin ..................... G11C 29/848 365/200 |
| 2011/0110164 A1 | 5/2011 | Jeong |
| 2011/0199811 A1* | 8/2011 | Kanno ..................... G11C 8/10 365/148 |
| 2012/0027077 A1 | 2/2012 | Reznik |
| 2012/0054549 A1 | 3/2012 | Kwan et al. |
| 2012/0092943 A1 | 4/2012 | Nishioka et al. |
| 2012/0267791 A1 | 10/2012 | Lee et al. |
| 2013/0083612 A1 | 4/2013 | Son et al. |
| 2013/0223171 A1 | 8/2013 | Kim et al. |
| 2013/0235644 A1 | 9/2013 | Chung |
| 2014/0049854 A1 | 2/2014 | Ho |
| 2014/0078842 A1 | 3/2014 | Oh et al. |
| 2014/0140138 A1 | 5/2014 | Tran et al. |
| 2014/0211567 A1 | 7/2014 | Chung |
| 2014/0223257 A1 | 8/2014 | Oh et al. |
| 2015/0135038 A1 | 5/2015 | Wilson et al. |
| 2015/0277790 A1 | 10/2015 | Mozak et al. |
| 2015/0287480 A1 | 10/2015 | Wilson et al. |
| 2016/0133310 A1 | 5/2016 | Wilson et al. |
| 2016/0232987 A1 | 8/2016 | Wilson et al. |
| 2016/0307647 A1 | 10/2016 | Morgan et al. |

OTHER PUBLICATIONS

Impact of I/O Settings on Signal Integrity in Stratix III Devices, Altera Corporation, Application Note 476, ver. 1.0, 15 pgs, Oct. 2007.
International Search Report and Written Opinion of Apr. 13, 2015 for International Patent Application No. PCT/US2015/015481 filed Feb. 11, 2015, 12 pages.
Cataldo, Anthony, "Virage Logic Readies self-repairing embedded memory," EE Times, Mar. 6, 2001, 2 pages, Mar. 6, 2001.

* cited by examiner

SOFT POST PACKAGE REPAIR OF MEMORY DEVICES

CROSS-REFERENCE TO RELATED APPLICATIONS

This application is a continuation of U.S. patent application Ser. No. 15/133,096, filed Apr. 19, 2016, which is a continuation of U.S. patent application Ser. No. 14/246,589, filed Apr. 7, 2014, issued as U.S. Pat. No. 9,343,184 on May 17, 2016. These applications and patent are incorporated by reference herein in their entirety and for all purposes.

BACKGROUND

Technical Field

This disclosure relates to memory devices, and more particularly, to post-packaging repair of a memory device.

Description of Related Technology

Memory cells of memory devices such as dynamic random access memories (DRAMs), static RAMs (SRAMs), flash memories, or the like can experience defects leading to errors and/or failures. In some cases, memory cells can be identified as defective (hereinafter "defective memory cells") after the memory device (e.g., a memory chip) has been packaged, such as in cases where the memory cells were not defective before the packaging process. Examples of packaging include, but are not limited to, encapsulation by epoxy, ceramic packages, metal/glass packages, and the like. After a memory device has been packaged, the memory device can be tested to identify defective memory cells. Addresses mapped (e.g., assigned) to defective memory cells can be remapped (e.g., reassigned) to functional memory cells (e.g., memory cells that have not been identified as defective) so that the memory device can still be effective.

Non-volatile memory (e.g., programmable elements, such as fuses or antifuses) can be programmed to store data corresponding to one or more addresses mapped to defective memory cells. One example of a group of programmable elements is a row of antifuses. An antifuse has a high resistance in its initial state. An antifuse can permanently create an electrically conductive path when a relatively high voltage is applied across the antifuse. An antifuse can have a structure similar to that of a capacitor, i.e., two conductive electrical terminals are separated by a dielectric layer. To create an electrically conductive path, a relatively high voltage is applied across the terminals, breaking down the interposed dielectric layer and forming a conductive link between the antifuse terminals. Creating a conductive path through an antifuse is referred to as "blowing an antifuse."

Certain protocols exist for performing post package repair. Post package repair can involve blowing antifuses. Blowing an antifuse can be performed in an antifuse programming time, which can be on the order of 200 milliseconds (ms). In some applications, such a delay can undesirably impact performance of a memory.

Accordingly, a need exists to improve post package repair.

BRIEF DESCRIPTION OF THE DRAWINGS

The embodiments will be better understood from the Detailed Description of Certain Embodiments and from the appended drawings, which are meant to illustrate and not to limit the embodiments.

DETAILED DESCRIPTION OF CERTAIN EMBODIMENTS

Figure 1:
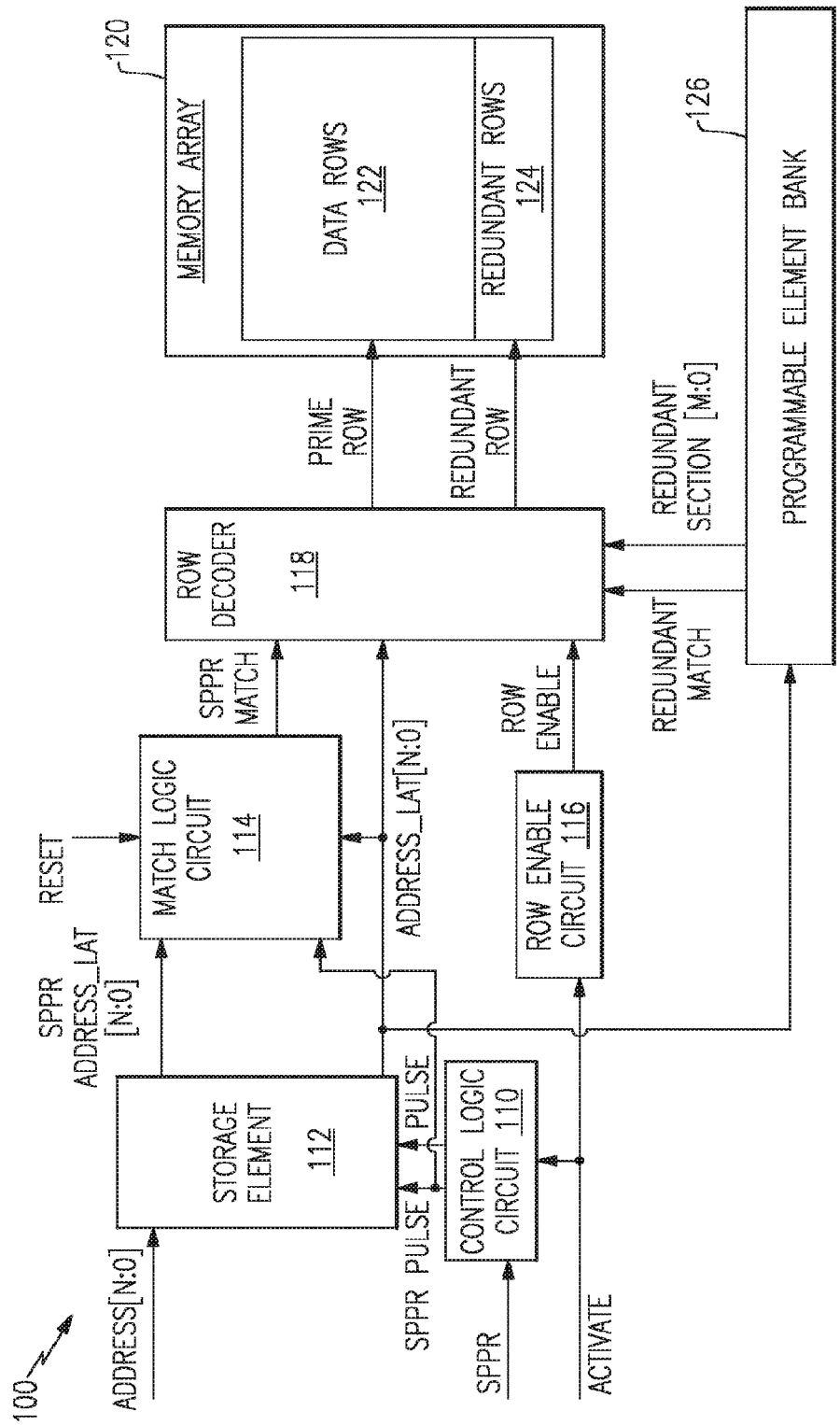
FIG. 1 is a schematic block diagram illustrating a memory bank of a memory device configured to remap memory addresses post packaging, according to an embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

After a memory device has been packaged, it is typically externally accessible only through nodes (e.g., contacts, pins, etc.) of the package, which can make repair of the memory device more difficult than prior to packaging. In addition, some defective memory cells might be identified (e.g., detected) after the memory device has been packaged and assembled into a larger unit, such as a dual-inline memory module (DIMM), flash memory card, smart phone, tablet computer, or the like. It is desirable to be able to repair memory devices after packaging, such as to improve overall yield and to reduce cost.

Some existing memory devices include groups (e.g., rows) of memory cells that can be used to replace defective groups (e.g., rows) of memory cells. In one such device, address data corresponding to a defective group of memory cells (hereinafter "defective address data") can be stored in programmable elements, such as antifuses or fuses. The programmable elements can be used to remap the address of the defective group of memory cells to another group of memory cells (e.g., a group of "redundant" memory cells) that is functional. Address data corresponding to an address to be accessed can be latched responsive to an Activate command. The device can then check if the latched address data matches the defective address data by comparing the latched address data with the defective address data. A row decoder, for example, can cause a selected row of memory cells to be activated to access data associated with the latched address data. The selected row can be a row of redundant memory cells when the latched address data matches the defective address data stored by the programmable elements.

Post package repair operations can involve blowing antifuses and/or blowing fuses. Blowing an antifuse can take on the order of 200 ms in current technologies. Such a delay can undesirably impact performance of a memory, as other memory operations can be performed on the order of 10 s of nanoseconds (ns) (e.g., in about 15 ns or about 20 ns) in current technologies. The methods and apparatus for performing post package repair disclosed herein can perform post package repair operations a similar amount of time as other memory operations. Accordingly, a delay for a post package repair operation can be on the order of a delay for another memory operation.

The post package repair discussed herein can be compatible with existing post package repair protocols. For instance, the post package repair discussed herein can be implemented with existing programmable elements banks, such as antifuse banks and/or fuse banks, used for pre-packaging and/or post package repair. Defective redundant memory cells can be repaired in accordance with the principles and advantages discussed herein. The methods and circuits of post packaged repair provided herein can be applied to a wide variety of memory devices, such as DRAMs, SRAMs, and NAND flash memories. In addition, circuit implementations of the post package repair discussed herein can consume a relatively small area.

Soft post package repair features can repair defective memory cells post-packaging. Soft post package repair can refer to a non-persistent method of post package repair. In soft post package repair, defective address data can be stored in volatile memory of the memory device after the memory device is packaged. The defective address data can, for example, correspond to a group of memory cells that were identified as defective post packaging. In some cases, the group of memory cells identified as defective post packaging could be a group of redundant memory cells to which an address has been previously remapped. In such cases, other defective address data can already be stored in programmable elements, such as antifuses, so that memory cells associated with the other defective address data are not accessed. The defective address data can be stored as part of a power up sequence of a memory device, for example. The defective address data can be stored in volatile memory until the memory device is powered down. A storage element comprising volatile memory, such as latches, registers, and/or flip-flops, can store the defective address data and a decoder can map the defective address to another group of memory cells, The other group of memory cells can be a group of redundant memory cells (e.g., a column or row of redundant memory cells) that are dedicated to soft post package repair. For instance, the defective address can be repeatedly mapped to the other group of memory cells.

Soft post package repair can be controlled by a controller that is external to the memory device. The controller can correspond to a memory controller, to test equipment, or the like. The controller can repair a packaged memory device by providing signals to nodes of the packaged memory device, in which defective address data is stored in a volatile manner. For example, the controller can provide signals on pre-existing Activate, Data Write, Data, and/or like nodes of a packaged DRAM device. In certain embodiments, the controller can redundantly store the defective address data in non-volatile memory stored outside of the packaged memory device that is being repaired for future retrieval. According to an embodiment, an apparatus can include a first memory device and a second memory device and the controller can be configured to retrieve defective address data from non-volatile memory of the second memory device and provide the retrieved defective address data to the first memory device. The first and second memory devices can be included in a packaged unit, such as a dual inline memory module or a memory card.

In an embodiment, soft post package repair can repair a memory device by remapping a defective address that had been previously remapped to a defective group of redundant memory cells, For example, a group of redundant memory cells to which an address has already been remapped could itself become defective post packaging. In one such embodiment, the defective address can be remapped to a different group of redundant memory cells.

A memory device that can perform soft post package repair can include memory cells in a package, volatile memory configured to store defective address data responsive to entering a soft post-package repair mode, a match logic circuit, and a decoder. The match logic circuit can generate a match signal indicating whether address data corresponding to an address of the memory cells to be accessed matches the defective address data stored in the volatile memory. The decoder can select a first group of the memory cells to be accessed instead of a second group of the memory cells responsive to the match signal indicating that the address data corresponding to the address to be accessed matches the defective address data stored in the volatile memory. The second group of the memory cells can correspond to a replacement address associated with other defective address data stored in non-volatile memory of the apparatus.

In the context of this document, a group of commonly coupled memory cells can correspond to, for example, a "row" of memory cells (which is also sometimes referred to herein as a "row of memory"). The group of commonly coupled memory cells can alternatively correspond to a "column" of memory cells. Repairing a row of memory can refer to, for example, reassigning the address previously assigned to a defective row of memory to another row of memory. "Programming," "enabling," and "disabling" a redundant row can mean, for example, programming, enabling, or disabling a group of redundant memory cells. A logic signal name ending with a trailing "F" can denote an active-low signal. However, it will be appreciated that the various embodiments of this document can include alternative active-high and/or active-low logic signals or logically equivalent circuits.

FIG. 1 is a schematic block diagram illustrating a memory bank of a memory device 100 configured to perform soft post package repair, according to an embodiment. The illustrated memory device 100 includes a control logic circuit 110, a storage element 112, a match logic circuit 114, a row enable circuit 116, a row decoder 118, a memory array 120 comprising data rows 122 and redundant rows 124, and a programmable element bank 126. The memory device 100 can include a mode register, and a soft post package repair mode can be entered responsive to a change in a value stored in the mode register. The memory device 100 can include more or fewer elements than illustrated in FIG. 1.

The control logic circuit 110 can receive a soft post package repair signal SPPR and an activate signal Activate as inputs and generate a pulse signal Pulse and a soft post package repair pulse SPPR Pulse. Both of these pulse signals can be asserted for a sufficient amount of time for volatile memory elements, such as latches, registers, SRAM, or the like, to capture data. Then the control logic circuit 110 can de-assert these pulse signals after the data has been captured. The soft post package repair signal SPPR can be asserted to enter a soft post package repair mode of operation. When the memory device 100 is operating in the soft post package repair mode, the activate signal Activate can be asserted when defective address data is provided to the memory device 100. The control logic circuit 110 can assert the soft post package repair pulse SPPR Pulse responsive to the activate signal Activate being asserted when the memory device 100 operates in the soft post package repair mode. The control logic circuit 110 can assert the pulse signal Pulse responsive to the activate signal Activate being asserted when the memory device 100 operates in a mode of operation other than the soft post package repair mode.

The storage element 112 can receive address data Address [N:0] and store the address data Address[N:0] in volatile memory elements. The storage element 112 can comprise any suitable volatile memory elements to store the address data Address[N:0]. The storage element 112 can include a first group of memory elements and a second group of memory elements. These groups of memory elements can be logically separate from each other. In some instances, these groups of memory elements can also be physically separate from each other. The first group of memory elements can store defective address data. The address data Address[N:0] can be stored in the first group of memory elements as defective address data when the soft post package repair pulse signal SPPR Pulse is asserted. The second group of memory elements can store address data corresponding to an address of the memory array 120 to be accessed (e.g., read or programmed). The address data Address[N:0] can be stored in the second group of memory elements when the pulse signal Pulse is asserted.

The match logic circuit 114 can compare address data from the first group of memory elements SPPR Addr_Lat [N:0] with address data from the second group of memory elements Addr_Lat[N:0]. The match logic circuit 114 can generate the soft post package repair match signal SPPR Match responsive to (e.g., based at least in part on) the comparison. The soft post package repair match signal SPPR Match can be asserted to indicate that the address to be accessed in the memory array 120 matches a defective address stored in the storage element 112. When the address to be accessed does not match a defective address stored in the storage element, the soft post package repair match signal SPPR Match can be de-asserted. The match logic circuit can also de-assert the soft post package repair match signal SPPR Match responsive to a reset signal Reset The row enable circuit 116 can include circuitry configured to control activating a row of the memory array 120. The row enable circuit 116 can receive the activate signal Activate and provide a row enable signal Row Enable to the row decoder 118. The row enable circuit 116 can provide a delay in enabling the row decoder 118 after the activate signal Activate is asserted. This can enable the row decoder 118 to select a row of the memory array 120 when address data and match signals are ready to provide a selected row address of the memory array 120, which can be an address remapped to a redundant row of the redundant rows 124 to repair a defective data row of the data rows 122 or a defective redundant row of the redundant rows 124.

The row decoder 118 can decode the address to be accessed to select a row of memory cells in the memory array 120 to which the address to be accessed is mapped. The selected row can be a data row of the data rows 122 when the address to be accessed is not known to be defective. For example, when the row enable signal Row Enable is asserted and the address to be accessed does not match a defective address stored in either storage element 112 or programmable element bank 126, a prime row signal Prime Row can be asserted to activate a row of the data rows 122 mapped to the address to be accessed as the selected row. The row decoder 118 can prevent a defective row from being activated responsive to the soft post package repair match signal, SPPR Match from the match logic circuit 114 and/or a redundant match signal Redundant Match from the programmable element bank 126.

When the address to be accessed matches a defective address stored in the storage element 112 and/or a detective address stored in the programmable element bank 126, the row decoder can decode the address to be accessed to select a redundant row of the redundant rows 124. A redundant row signal Redundant Row can be asserted to activate a row of the redundant rows 124 mapped to the address to be accessed as the selected row. Responsive to the soft post package repair match signal SPPR Match being asserted, a different row of the redundant rows 124 can be activated instead of a row of the redundant rows 124 that would have been activated if only the redundant match signal Redundant Match had been asserted.

For example, responsive to the redundant match signal Redundant Match being asserted, the row decoder 118 can decode redundant row address data Redundant Section[M: 0], provided by the programmable element bank 126 as corresponding to the address to be accessed, to select a redundant row of the redundant rows 124 to which a defective address has been originally remapped. Responsive to the soft post package repair match signal SPPR Match indicating that the address to be accessed matches a defective address stored in the storage element 112, the row decoder 118 can select a different redundant row of the redundant rows 124 instead, such as in a case where the redundant row to which the defective address had been originally remapped has later been identified as defective. Accordingly, storing the defective address data in the storage element 112 can be used to prevent a defective row of the redundant rows 124 from being selected.

The memory array 120 can include volatile or non-volatile memory cells. Some examples of memory cells that can be implemented in the memory array 120 include DRAM cells, SRAM cells, flash memory cells, such as NAND flash memory cells, phase change memory cells, and the like. As illustrated, the memory array 120 includes data rows 122 and redundant rows 124. The redundant rows 124 can be used to replace defective data rows 122 or a defective redundant row.

The programmable element bank 126 can store defective address data in the array 120 using programmable elements. The programmable element bank 126 can compare address data corresponding to an address to be accessed Address_Lat [N:0] with the defective address data stored by the programmable elements to determine whether the address to be accessed corresponds to a defective address of the array 120. The programmable element bank 126 can generate a redundant match signal indicative of whether the address to be accessed matches a defective address of the array 120. The programmable element bank 126 can provide redundant address data Redundant Section [3:0] used to select a row of the redundant rows 124 to which the defective address has been remapped.

FIG. 1 illustrates one bank of a memory device 100. In certain embodiments, some or all of the circuits illustrated in FIG. 1 can be replicated in two or more banks of the memory device 100. Accordingly, the soft post package repair described with reference to FIG. 1 can be a per bank solution. In one embodiment, multiple banks of the memory device 100 can simultaneously perform soft post package repair. Alternatively or additionally, two or more banks of the memory device 100 can sequentially perform soft post package repair.

Figure 2:
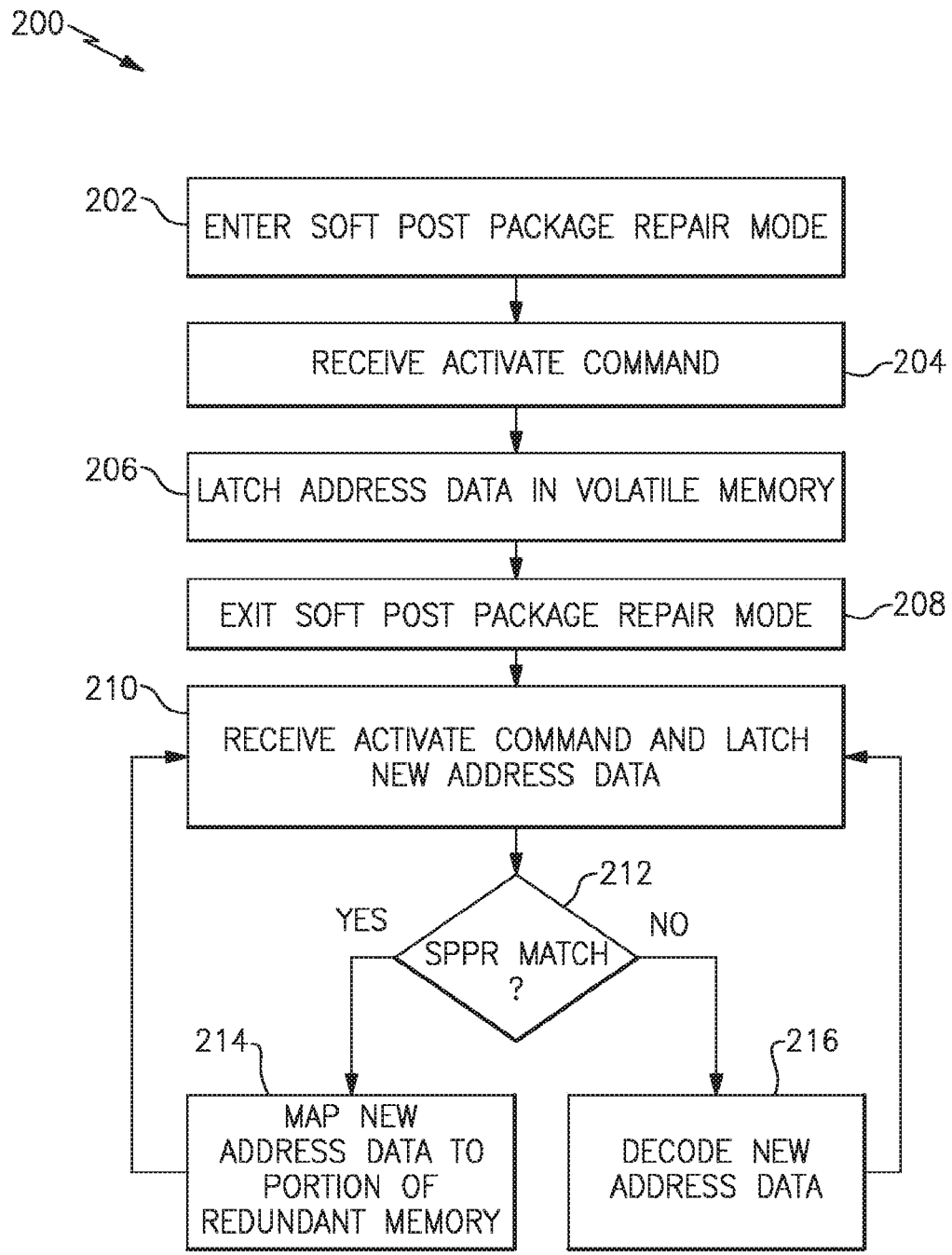
FIG. 2 is a flow diagram of an illustrative process of performing a post package repair, according to an embodiment.

FIG. 2 is a flow diagram of an illustrative process 200 of soft post package repair according to an embodiment. The process 200 can be implemented by the memory device 100 of FIG. 1, for example. Any combination of the features of the process 200 can be embodied in code stored in a non-transitory computer readable storage. When executed, the non-transitory computer readable storage can cause some or all of any of the process 200 to be performed. It will be understood that any of the methods discussed herein may include greater or fewer operations and that the operations may be performed in any order, as appropriate.

The process 200 can perform soft post package repair. In one embodiment, the process 200 is performed as part of a power up sequence of a memory device and/or in response to an instruction received from a device outside the package, such as from a memory controller or from test equipment. At block 202, the soft post package repair mode can be entered. The soft post package repair mode can be entered responsive to receiving a soft post package repair command at an externally accessible node of a package of a memory device, such as the memory device 100. Prior to entering the soft post package repair mode, operations of other post package repair modes can be performed.

While operating in the soft post package repair mode, an activate command can be received at block 204. The activate command can be followed by a precharge. Defective address data can be provided with the activate command. The defective address might be currently mapped to a group of "regular" memory cells or might have already been remapped to a group of redundant memory cells. The defective address data can be stored in volatile memory of a storage element, such as a latch or a register, at block 206. More than one defective address can be stored in the storage element during the soft post package repair mode such that multiple defective portions of the memory array can be repaired by soft post package repair. After the defective address data is stored in the storage element, soft post package repair mode can be exited at block 208.

During operation of the memory device, memory access operations can be performed responsive to inputs received at one or more externally accessible nodes of the package of the memory device. The memory access operations can include read operations and/or programming operations. As part of the memory access operations, an activate command can be received. The activate command can be received with an address to be accessed at block 210. The address data corresponding to the address to be accessed can also be stored in volatile memory of a storage element at block 210.

The address to be accessed can be compared to the defective address (e.g., multiple defective addresses) to determine whether there is a soft post package repair match at block 212. When the address to be accessed matches a defective address stored in the storage element, a soft post package repair match is present. The defective address can be remapped to a group of functional memory cells of the memory array at block 214. A decoder can perform such remapping. The decoder can also override a replacement address associated with other defective address data previously stored in non-volatile memory, in which the replacement address corresponds to a different (e.g., now defective) group of memory cells that were previously mapped to the address to be accessed. The replacement address can mapped to a location of the non-volatile memory that stores the other defective address data. For instance, replacement address data can be generated by a decoder based on the location of the non-volatile memory that stores the other defective address data. Alternatively, the replacement address can be stored in the non-volatile memory. The process can then continue at block 210.

On the other hand, when the address to be accessed does not match a defective address stored in the storage element at block 212, a soft post package repair match is not present. In that case, the address to be accessed can be decoded by a decoder at block 216. The decoder can select a group of memory cells of the memory array mapped to the address to be accessed. The selected group of memory cells of the memory array can be either a group of regular memory cells or a group of redundant memory cells of the memory array. The process can then continue at block 210.

Figure 3:
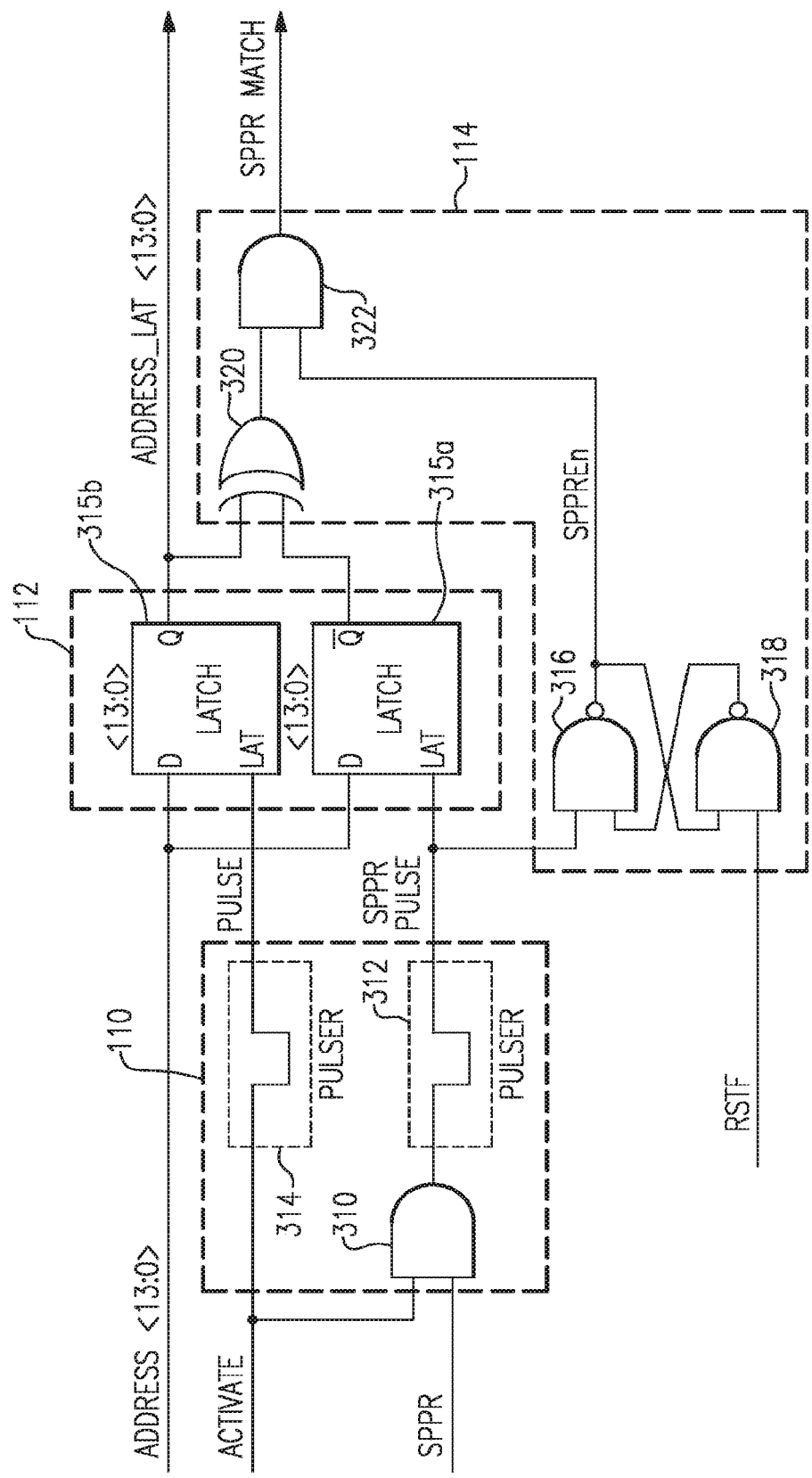
FIG. 3 is a schematic diagram of a portion of the memory device of FIG. 1, according to an embodiment.

FIG. 3 is a schematic diagram of a portion of the memory device 100 of FIG. 1, according to an embodiment. The portion of the memory device 100 illustrated in FIG. 3 includes the control logic circuit 110, the storage element 112, and the match logic circuit 114.

The control logic circuit 110 can perform a logical AND of the soft post package repair signal SPPR and the activate signal Activate using an AND gate 310 or any equivalent circuit. A first pulse circuit 312 can generate the soft post package repair pulse SPPR Pulse from the output of the AND gate 310 so that defective address data can be captured by the storage element 112, such as described with reference to block 206 of the process 200 of FIG. 2. A second pulse circuit 314 can generate the pulse signal Pulse from the activate signal Activate so that address data corresponding to an address to be accessed can be captured by the storage element 112. The address to be accessed can be stored, for example, as described in connection with block 210 of the process 200 of FIG. 2. The pulse circuits 312 and 314 can be implemented by a logic gate, such as a NAND gate or a NOR gate, and buffers, such as one or more inverters. The buffers can delay a signal such that the logic gate generates a pulse signal responsive to the signal being delayed being asserted. The pulse circuits 312 and 314 can generate pulses for the storage element 112 such that the address data Address<13:0> is stored by the storage element 112 when the address data is ready to be stored.

The storage element 112 can include the first group of memory elements 315a and the second group of memory elements 315b. These memory elements can be latches, such as the illustrated D-type latches, or other suitable volatile memory elements. Although the first group of memory elements 315a and the second group of memory elements 315b are each configured to store 14 bits of data in FIG. 3, these memory elements can be configure to store any suitable amount of data. The address data stored by the first group of memory elements 315a and the second group of memory elements 315b can be provided to the match logic circuit 114.

The match logic circuit 114 can compare the address data. For example, the match logic circuit 114 can perform an XOR logic function on each bit of data stored in the first group of memory elements 315a and the complement of the corresponding bit of data stored in the second group of memory elements 315b. The XOR circuit 320 can generate an output indicative of whether all of the bits stored in the first group of memory elements 315a and the second group of memory elements 315b match. A latch of the match logic circuit 114 can generate a soft post package repair enable signal SPPREn.

As illustrated, the clock input of the first group of memory elements 315a and an active low reset signal RSTF can be provided to inputs of an $\overline{S}\,\overline{R}$ NAND latch that generates the soft post package repair enable signal SPPREn. The $\overline{S}\,\overline{R}$ NAND latch can be implemented by a first NAND gate 316 and a second NAND gate 318. This latch can assert the soft post package repair enable signal SPPREn responsive to the soft post package repair pulse SPPR Pulse being asserted while operating in a mode other than reset mode. On the other hand, this latch can de-assert the soft post package repair enable signal SPPREn responsive to the soft post package repair pulse SPPR Pulse not being asserted while operating in the reset mode.

When the XOR circuit 320 indicates that all of the bits of the defective address data match with corresponding bits of the address data corresponding to the address to be addressed and the soft post package repair signal enable signal SPPREn is asserted, the soft post package repair match signal SPPR Match can be asserted. An AND gate 322 or any other suitable circuit can be used to perform a logical AND function of the output of the XOR circuit 320 and the soft post package repair enable signal SPPREn.

Figure 4:
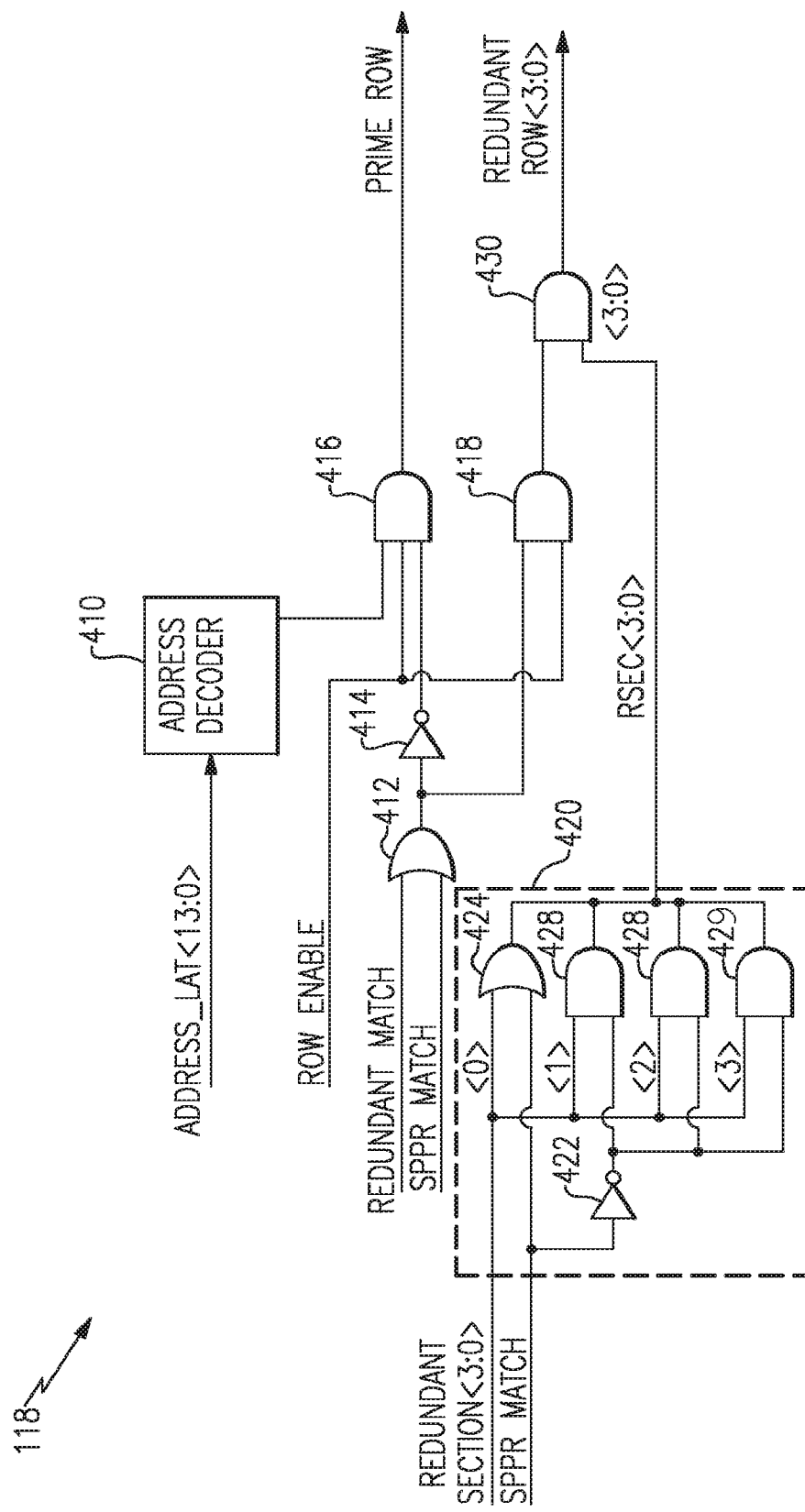
FIG. 4 is a schematic diagram of a row decoder of the memory device 100 of FIG. 1, according to an embodiment.

FIG. 4 is a schematic diagram of a row decoder 118 of the memory device 100 of FIG. 1, according to an embodiment. The row decoder 118 can include an address decoder 410 configured to decode the address data corresponding to the address to be accessed Address_Lat<13:0> as provided by the storage element 112. A prime row of the data rows 122 can be selected when the address decoder 410 maps the address to be accessed Address_Lat<13:0> to the prime row, the row enable signal Row Enable is asserted, and neither a redundant match nor a soft post package repair match is present. An AND gate 416 can be provided for each row of the data rows 122. The AND gate 416 can perform a logical AND of an output of the address decoder 410 corresponding to selected row of the data rows 122, the row enable signal Row Enable, and a signal indicative of the address to be accessed being defective. The signal indicative of the address to be accessed being detective can be generated by a NOR logic function of the redundant match signal Redundant Match and the soft post package repair match signal SPPR Match. As illustrated, the NOR logic function is implemented by an OR gate 412 and an inverter 414.

The row decoder 118 can select a redundant row of the redundant rows 124 when the address to be accessed is known to be defective, The row decoder 118 can select a row from the redundant rows 124 when defective address data stored in the storage element 112 or defective address data stored in the programmable element bank 126 indicates that the address to be accessed is defective. A redundant row signal can select a row of the redundant rows 124 when there is a redundant match or an SPPR match and the row enable signal Row Enable signal is asserted. The OR gate 412 and the AND gate 418 can implement this logical function.

Redundant address data Redundant Section<3:0> can be decoded to select which of the redundant rows 124 to select. The row decoder 118 can also map a defective address to a different one of the redundant rows 124 instead, These functions can be implemented with any suitable decoder logic. As illustrated, the decoder logic includes OR gate 424 and AND gates 426, 428, and 429. The AND gates 426, 428, and 429 can prevent a row from being selected when there is a SPPR match. Accordingly, the decoder logic can override a replacement address corresponding to other defective address data stored in non-volatile memory, This can assign a higher priority to a soft post package repair solution when more than one type of repair solution is implemented for a particular access address. An inverter 422 is provided to generate the complement of the SPPR match signal. On the other hand, the OR gate 424 can select a particular row of the redundant rows 124 (i.e., Redundant Row[0] in the embodiment of FIG. 4) when there is a SPPR match. Accordingly, the particular redundant row can be selected when a defective row of the memory array 120 is corrected by soft post package repair. The particular redundant row can replace a data row 122 that was originally mapped to the defective address stored in the storage element 112. The particular redundant row can also replace another of the redundant rows 124 that would otherwise have been mapped to the defective address stored in the storage element 112.

The outputs of the decoder logic can be combined with a signal indicative of a detective memory row, For example, as illustrated, an AND gate 430 can perform a logical AND of the output of AND gate 418 and a respective output of the decoder logic for each of the redundant rows 124.

In the embodiment of FIG. 4, the redundant rows 124 of the memory array 120 of FIG. 1 include 4 redundant rows. Any suitable number of redundant rows can be implemented in accordance with other embodiments. Moreover, the decoder logic can be modified to select two or more particular rows of the redundant rows 124 to enable soft post package repair using two or more redundant rows.

The principles and advantages described above can apply to various apparatuses including semiconductor devices or components. Examples of such apparatuses can include, but are not limited to, consumer electronic products, electronic circuits, electronic circuit components, parts of the consumer electronic products, electronic test equipment, etc. Examples of such apparatuses can also include memory chips, memory modules such as dual-inline memory modules (DIMMs), receiver circuits of optical networks or other communication networks, and disk driver circuits. Consumer electronic products can include, but are not limited to, a mobile phone, a smart phone, a telephone, a television, a computer monitor, a computer, a hand-held computer, a tablet computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, apparatuses can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is clamed is:

1. A method of operating a memory device that has been packaged and includes a memory array and a first storage element, the method comprising:
    entering the memory device into a post package repair mode; and
    issuing to the memory device a first activate command with first address data while the memory device is in the post package repair mode, wherein the first activate command causes the memory device to store the first address data in the first storage element as first defective address data and to be free from accessing the memory array responsive to the first address data, and wherein the first defective address data corresponds to a data address of the memory array to be accessed that includes at least one defective memory cell.

2. The method of claim 1,
    wherein the post package repair mode is a soft post package repair mode and the first storage element comprises a volatile memory.

3. The method of claim 1,
    wherein the memory device further includes a mode register; and wherein the entering the memory device into a post package repair mode comprises changing a value stored in the mode register.

4. The method of claim 1, further comprising:
exiting the memory device from the post package repair mode; and
issuing to the memory device a second activate command with second address data while the memory device is out of the post package repair mode, wherein the second activate command causes the memory device to compare the second address data with the first address data stored in the first storage element to produce a comparison result.

5. The method of claim 4,
wherein the memory array comprises a plurality of data addresses and a plurality of redundant addresses; and
wherein the second activate command further causes the memory device to access at least one of the plurality of data addresses when the comparison result indicates that the second address data and the first address data stored in the first storage element do not match and to access at least one of the plurality of redundant addresses when the second address data and the first address data stored in the first storage element match.

6. The method of claim 4,
wherein the memory device further includes a second storage element; and
wherein the second activate command further causes the memory device to store the second address data in the second storage element.

7. The method of claim 6,
wherein each of the first and second storage elements comprises a volatile memory.

8. A method of operating a memory device that includes a memory array, a first storage element and a programmable element, the method comprising:
storing, before packaging the memory device, first defective address data in the programmable element, wherein the first defective address data corresponds to a first address of the memory array to be accessed that includes at least one defective memory cell;
packaging the memory device;
entering, after the memory device has been packaged, the memory device into a post package repair mode; and
issuing to the memory device a first activate command with first address data while the memory device is in the post package repair mode, wherein the first activate command causes the memory device to store the first address data in the first storage element as second defective address data, wherein the second defective address data corresponds to a second address of the memory array to be accessed that includes at least another detective memory cell, and wherein the first activate command does not cause the memory device to access the memory array responsive to the first address data.

9. The method of claim 8,
wherein the post package repair mode is a soft post package repair mode;
wherein the first storage element comprises a volatile memory; and
wherein the programmable element comprises anon-volatile memory.

10. The method of claim 8,
wherein the memory device further includes a mode register; and wherein the entering the memory device into a post package repair mode comprises changing a value stored in the mode register.

11. The method of claim 9, further comprising:
exiting the memory device from the soft post package repair mode; and
issuing to the memory device a second activate command with second address data while the memory device is out of the post package repair mode, wherein the second activate command causes the memory device to compare the second address data with each of the first and second defective address data to produce a comparison result.

12. The method of claim 11,
wherein the second activate command further causes the memory device to access a third address of the memory array when the comparison result indicates that the second address data does not match with each of the first and second defective address data, to access a first redundant address of the memory array when the second address data matches with the first defective address data, and to access a second redundant address of the memory array when the second address data matches with the second defective address data.

13. The method of claim 12,
wherein the memory device further includes a second storage element; and
wherein the second activate command further causes the memory device to store the second address data in the second storage element.

14. The method of claim 13,
wherein each of the first and second storage elements comprises a volatile memory; and
wherein the programmable element comprises a non-volatile memory.

15. An apparatus comprising:
a controller; and
a memory device coupled to the controller, wherein the memory device comprises a memory array, a non-volatile memory and a volatile memory,
wherein the controller is configured to:
    enter the memory device into a soft post package repair mode; and
    issue to the memory device a first activate command with first address data while the memory device is in the soft post package repair mode; and
    wherein the first activate command causes the memory device to store and hold the first address data in the volatile memory as first defective address data, the first defective address data corresponding to a first address of the memory array to be accessed that includes at least one defective memory cell.

16. The apparatus of claim 15, wherein the controller is further configured to:
exit the memory device from the soft post package repair mode; and
issue to the memory device a second activate command with second address data while the memory device is out of the soft post package repair mode; and
wherein the second activate command further causes the memory device to compare the second address data with the first defective address data to produce a first comparison output.

17. The apparatus of claim 16, wherein the second activate command further causes the memory device to access a second address of the memory array when the first comparison output indicates that the second address data and the first defective address data do not match and to access a redundant address of the memory array when the first comparison output indicates that the second address data and the first defective address data match.

18. The apparatus of claim 16, wherein the non-volatile memory is configured to store second defective address data, the second defective address data corresponding to a second address of the memory array to be accessed that includes at least another defective memory cell; and wherein the second activate command further causes the memory device to compare the second address data with the second defective address data to produce a second comparison output.

19. The apparatus of claim 18, wherein the second activate command further causes the memory device to access a third address of the memory array when the first comparison output indicates that the second address data and the first defective address data do not match and the second comparison output indicates that the second address data and the second defective address data do not match, to access a first redundant address of the memory array when the first comparison output indicates that the second address data and the first defective address data match, and to access a second redundant address of the memory array when the second comparison output indicates that the second address data and the second defective address data match.

20. The apparatus of claim 15, wherein the first defective address data is not loaded to the non-volatile memory.

* * * * *